United States Patent
Notsu et al.

(10) Patent No.: US 6,828,214 B2
(45) Date of Patent: Dec. 7, 2004

(54) SEMICONDUCTOR MEMBER MANUFACTURING METHOD AND SEMICONDUCTOR DEVICE MANUFACTURING METHOD

(75) Inventors: Kazuya Notsu, Kanagawa (JP); Nobuhiko Sato, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 198 days.

(21) Appl. No.: 10/112,751

(22) Filed: Apr. 2, 2002

(65) Prior Publication Data

US 2002/0146892 A1 Oct. 10, 2002

(30) Foreign Application Priority Data

Apr. 6, 2001 (JP) .......................................... 2001-109002

(51) Int. Cl.[7] ........................... H01L 21/30; H01L 21/46
(52) U.S. Cl. ...................... 438/455; 438/458; 438/459; 438/558; 438/563
(58) Field of Search ................................ 438/455, 458, 438/558, 933

(56) References Cited

U.S. PATENT DOCUMENTS

| | | | |
|---|---|---|---|
| 5,461,243 A | 10/1995 | Ek et al. ...................... | 257/190 |
| 5,759,898 A | 6/1998 | Ek et al. ...................... | 438/291 |
| 5,882,987 A * | 3/1999 | Srikrishnan .................. | 438/458 |
| 6,106,613 A | 8/2000 | Sato et al. ..................... | 117/54 |
| 6,143,628 A | 11/2000 | Sato ........................... | 438/455 |
| 6,171,982 B1 | 1/2001 | Sato ........................... | 438/795 |
| 6,221,738 B1 | 4/2001 | Sakaguchi ................... | 438/455 |
| 6,323,108 B1 * | 11/2001 | Kub et al. ................... | 438/458 |
| 6,335,269 B1 | 1/2002 | Sato ........................... | 438/509 |
| 6,375,738 B1 | 4/2002 | Sato ........................... | 117/89 |
| 6,407,367 B1 | 6/2002 | Ito ............................. | 219/390 |
| 6,413,874 B1 | 7/2002 | Sato ........................... | 438/714 |
| 6,524,935 B1 * | 2/2003 | Canaperi et al. ............. | 438/478 |
| 6,537,846 B2 * | 3/2003 | Lee et al. .................... | 438/102 |

FOREIGN PATENT DOCUMENTS

| | | |
|---|---|---|
| JP | 2000-243946 | 9/2000 |
| WO | WO98/52216 | 11/1998 |

OTHER PUBLICATIONS

"A Novel Fabrication Technique of Ultra–Thin and Relaxed SiGe Buffer Layers with High Ge Content for Sub–100 nm Strained Silicon–On–Insulator MOSFETs", T. Tezuka et al., Extended Abstracts of the 2000 International Conference on Solid State Devices and Materials, Sendal, 2000, pp. 472–473.

"Design of SiGe/Buried Oxide Layered Structure to Form Highly Strained Si Layer on Insulator for SOI MOSFETs", N. Sugiyama et al., Extended Abstracts of the 2000 International Conference on Solid State Devices and Materials, Sendal, 2000, pp. 474–475.

* cited by examiner

Primary Examiner—John F. Niebling
Assistant Examiner—Angel Roman
(74) Attorney, Agent, or Firm—Fitzpatrick, Cella, Harper & Scinto

(57) ABSTRACT

This invention provides an SOI substrate manufacturing method using a transfer method (bonding and separation). A separation layer (12) is formed on a silicon substrate (11). A silicon layer (13), SiGe layer (14), silicon layer (15'), and insulating layer (21) are sequentially formed on the resultant structure to prepare a first substrate (10'). This first substrate (10') is bonded to a second substrate (30). The bonded substrate stack is separated into two parts at the separation layer (12). Next, Ge in the SiGe layer (14) is diffused into the silicon layer (13) by hydrogen annealing. With this process, a strained SOI substrate having the SiGe layer on the insulating layer (21) and a strained silicon layer on the SiGe layer is obtained.

25 Claims, 20 Drawing Sheets

SEMICONDUCTOR MEMBER MANUFACTURING METHOD AND SEMICONDUCTOR DEVICE MANUFACTURING METHOD

FIELD OF THE INVENTION

The present invention relates to a semiconductor member manufacturing method and semiconductor device manufacturing method.

BACKGROUND OF THE INVENTION

As a substrate for forming a semiconductor device with a high speed and low power consumption, a substrate having a strained silicon layer has received a great deal of attention. When a layer (SiGe layer) made of silicon (Si) and germanium (Ge) is grown on a silicon substrate, and a single-crystal silicon layer is grown on the resultant structure, the silicon layer is strained. Thus, a strained silicon layer is obtained. This strain occurs because the lattice constant of the layer made of silicon and germanium is slightly larger than that of the single-crystal silicon layer.

An SOI substrate having a buried oxide film in a silicon substrate has also received attention and been put into practical use as a substrate for forming a semiconductor device with a high speed and low power consumption.

Also, a technique has been reported, in which a first SiGe layer is formed on a silicon substrate, a second SiGe layer having a higher Ge concentration than the first SiGe layer is formed, and a buried oxide film serving as an insulating layer is formed near the interface between the first and second SiGe layers by SIMOX (Separation by Ion iMplanted OXygen), thereby obtaining a thin SiGe layer with a high Ge concentration on the buried oxide film ("A Novel Fabrication Technique of Ultra-Thin and Relaxed SiGe Buffer Layers with High Ge Content for Sub-100 nm Strained Silicon-On-Insulator MOSFETs", T. Tezuka et al., EXTENDED ABSTRACTS OF THE 2000 INTERNATIONAL CONFERENCE ON SOLID STATE DEVICES AND MATERIALS, Sendai, 2000, pp. 472–473; "Design of SiGe/Buried Oxide Layered Structure to Form Highly Strained Si Layer on Insulator for SOI MOSFETs", N. Sugiyama et al., EXTENDED ABSTRACTS OF THE 2000 INTERNATIONAL CONFERENCE ON SOLID STATE DEVICES AND MATERIALS, Sendai, 2000, pp. 474–475).

As a characteristic feature of the technique by T. Tezuka et al. and N. Sugiyama et al., SIMOX is used to form a structure with an SiGe layer on an insulating layer. Hence, this technique latently has a technical disadvantage in SIMOX. In SIMOX, a large number of oxygen ions are implanted into a silicon substrate to form a buried oxide film in the silicon substrate. For this reason, in SIMOX, many crystal defects are formed in the silicon substrate, and it is therefore difficult to ensure quality enough to form a minority carrier device. In addition, the oxide film formed in the silicon substrate by SIMOX requires a higher quality. These points are taken into consideration. In the technique reported by T. Tezuka et al. and N. Sugiyama et al., a number of crystal defects (e.g., dislocation) are generated in the SiGe layer by the SIMOX process. Additionally, it is difficult to improve the quality of the buried oxide film. Hence, it is supposed to be difficult to make full use of the latent effects of the strained silicon and SOI structure.

SUMMARY OF THE INVENTION

The present invention has been made in consideration of the above situation, and has as its object to provide a new technique for forming a semiconductor member having, e.g., a layer containing silicon and an additive substance on an insulating layer, and a strained silicon layer on the resultant structure.

According to the first aspect of the present invention, there is provided a method of manufacturing a semiconductor member having a layer formed from silicon and an additive material on an insulating layer, comprising a) the preparation step of preparing a first member having a second layer substantially formed from silicon on a first layer containing silicon and the additive material, b) the transfer step of bonding the first and second members via the insulating layer while placing the second layer inside, and transferring the first and second layers from the first member to the second member, and c) the diffusion step of diffusing the additive material contained in the first layer into the second layer. The insulating layer only need be formed at least on the first member side or on the second member side. The insulating layer may be formed on both of the first and second member sides.

According to the preferred embodiment of the present invention, the preparation step comprises the stacking step of forming the second layer on the first layer, the manufacturing method comprises the insulating layer forming step of forming the insulating layer on the second layer of the first member, and the stacking step, insulating layer forming step, and transfer step are executed in an order of the stacking step, insulating layer forming step, and transfer step.

According to the preferred embodiment of the present invention, the first member has a silicon layer under the first layer, and in the transfer step, a portion from the silicon layer to the insulating layer is transferred from the first member to the second member.

According to the preferred embodiment, the diffusion step is executed after the transfer step. In such a method, it is preferable that the method further comprises, after the diffusion step, the growing step of growing a silicon layer on the first layer on the second member.

According to the preferred embodiment, the diffusion step is executed after the insulating layer forming step and before the transfer step.

According to the preferred embodiment, in the insulating layer forming step, the insulating layer is formed by thermal oxidation with annealing at a temperature enough to diffuse the additive material, thereby parallelly executing the insulating layer forming step and diffusion step.

According to the preferred embodiment, in the insulating layer forming step, the insulating layer is formed by thermal oxidation with annealing at a temperature enough to diffuse the additive material, the diffusion step comprises the first and second diffusion steps, the fist diffusion step is executed by annealing in the insulating layer forming step in parallel to the insulating layer forming step, and the second diffusion step is executed after the transfer step. In such a method, it is preferable that the method further comprises, after the second diffusion step, the growing step of growing a silicon layer on the first layer on the second member.

According to the preferred embodiment, the method further comprises, after the transfer step, the thermal oxidation step of thermally oxidizing a surface layer of the second member, and the removal step of removing a thermal oxide film formed on the second member by the thermal oxidation step. In such a method, it is preferable that the method further comprises, after the removal step, the growing step of growing a silicon layer on the second member.

According to the preferred embodiment, it is preferable that the additive material contains germanium.

According to the preferred embodiment, it is preferable that the insulating layer is a silicon oxide film.

According to the preferred embodiment, the first member has a separation layer under the first layer, and in the transfer step, the second member is bonded to the first member having the insulating layer formed by the insulating layer forming step, and then, a member formed by bonding is separated at the separation layer.

According to the preferred embodiment, in the transfer step, a separation layer is formed in the first member having the insulating layer by ion implantation, the second member is bonded to the first member having the separation layer, and then, a member formed by bonding is separated at the separation layer.

According to the preferred embodiment, the first and second layers of the first member are formed by CVD.

According to the preferred embodiment, the first and second layers of the first member are continuously formed in a single CVD step while gradually or stepwise changing a flow rate or concentration of a source gas that supplies the additive material.

According to the preferred embodiment, the first member has the first and second layers on a silicon substrate, and a separation layer at least at one of a portion in the first layer, an interface between the first layer and the silicon substrate, and a portion in the silicon substrate. The separation layer can be, e.g., a porous layer formed by anodizing or an ion-implanted layer.

According to the preferred embodiment, the layer formed from silicon and the additive material is made adjacent to the insulating layer by the diffusion step.

According to the second aspect of the present invention, there is provided a method of manufacturing a semiconductor member having a layer formed from silicon and an additive material on an insulating layer, comprising a) the preparation step of preparing a first member having a second layer substantially formed from silicon on a first layer containing silicon and the additive material, b) the transfer step of bonding the first member and the insulative second member while placing the second layer inside, and transferring the first and second layers from the first member to the second member, and c) the diffusion step of diffusing the additive material contained in the first layer into the second layer.

According to the third aspect of the present invention, there is provided a semiconductor device manufacturing method comprising a) the preparation step of preparing a first member having a second layer substantially formed from silicon on a first layer containing silicon and the additive material, b) the transfer step of bonding the first and second members via the insulating layer while placing the second layer inside, and transferring the first and second layers from the first member to the second member, c) the diffusion step of diffusing the additive material contained in the first layer into the second layer, d) the strained silicon layer forming step of forming a strained silicon layer on the first layer transferred onto the second member, and e) the circuit element forming step of forming a circuit element on the strained silicon layer.

According to the fourth aspect of the present invention, there is provided a semiconductor device manufacturing method comprising a) the preparation step of preparing a first member having a second layer substantially formed from silicon on a first layer containing silicon and the additive material, b) the transfer step of bonding the first member and the insulative second member while placing the second layer inside, and transferring the first and second layers from the first member to the second member, c) the diffusion step of diffusing the additive material contained in the first layer into the second layer, d) the strained silicon layer forming step of forming a strained silicon layer on the first layer transferred onto the second member, and e) the circuit element forming step of forming a circuit element on the strained silicon layer.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Figure 1A:
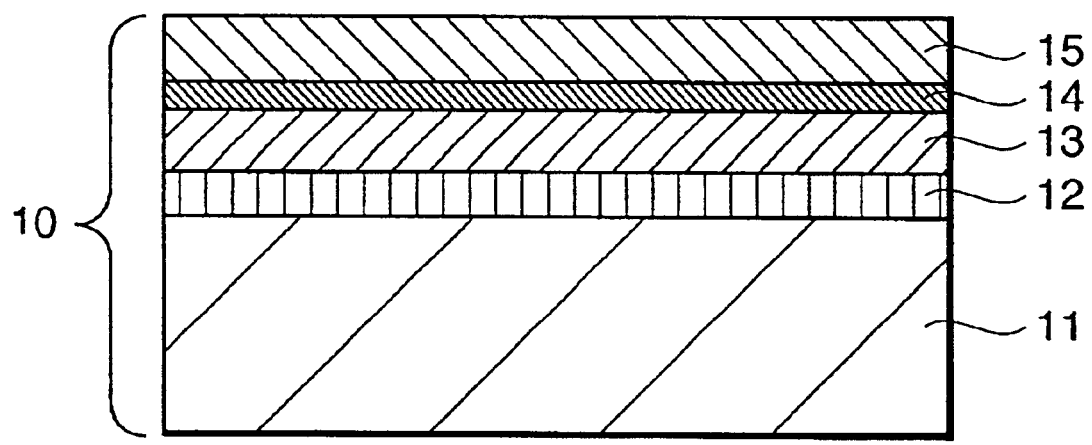
FIG. 1A is a sectional view showing the stacking step of the first and second embodiments.

As a characteristic feature of the preferred embodiments of the present invention, a transfer method is used to form a structure having a layer containing silicon and an additive substance on an insulating layer, and a strained silicon layer on the resultant structure. In the transfer method, a first member having a layer to be transferred (the layer to be transferred is formed from two or more layers) on a separation layer with a fragile structure is bonded to a second member via the layer to be transferred, and then, the composite member (bonded member) formed by bonding is separated at the separation layer.

According to this method, the layer to be transferred is transferred from the first member to the second member such that the lower layer of the layer to be transferred, which is formed on the first member, becomes the upper layer of the second member, and the upper layer of the layer to be transferred, which is formed on the first member, becomes the lower layer of the second member. That is, according to this method, the layers that are sequentially stacked on the first member are stacked on the second substrate of the second member in a reverse order.

According to a preferred embodiment of the present invention, a separation layer is formed on the surface of a first member, a layer (SiGe layer) containing silicon and germanium serving as an additive material is formed as a first layer on the separation layer, a layer (preferably a single-crystal silicon layer) substantially made of silicon is formed as a second layer on the SiGe layer, and an insulating layer is formed on the resultant structure by thermal oxidation or the like. Next, the second member is bonded to the first member via the insulating layer. The composite member formed by bonding is separated at the separation layer.

As the first member, a silicon substrate is typically used. The separation layer is typically formed by converting the silicon substrate surface into a porous structure by anodizing.

In this method, the single-crystal silicon layer serving as the second layer advantageously functions in forming a high-quality insulating layer on it. This is because when the second layer is a silicon layer, an insulating layer can be formed by oxidizing the silicon layer by thermal oxidation. Note that a high-quality thermal oxide film can be formed by thermal oxidation, as is known by those skilled in the art.

The manufacturing method of this embodiment includes the diffusion step of diffusing germanium contained in the first layer to the second layer until the germanium partially reaches the insulating layer stacked on the second layer. This diffusion layer can be executed in parallel to the insulating layer forming step or after the insulating layer forming step (e.g., a) between the insulating layer forming step and the bonding step, b) between the bonding step and the separation step, c) after the separation step, or d) after another step executed after the separation step). Especially, when the insulating layer is made of a silicon oxide layer, the diffusion rate of Ge in silicon oxide is very low, and Ge can be therefore suppressed from entering the silicon oxide layer in the diffusion step.

With the above step, a semiconductor member having an insulating layer on the second member and a layer (SiGe layer) containing silicon and germanium on the insulating layer can be obtained.

In the manufacturing method of this embodiment, a silicon layer is grown on the SiGe layer of the semiconductor member obtained in the above step. This silicon layer is a strained silicon layer because it has a lattice constant different from that of the underlying SiGe layer.

The manufacturing method according to this embodiment can further include the step of forming a circuit element using the strained silicon layer as an active layer. A device having such a circuit element can attain a high speed and low power consumption.

In the above method, a silicon layer is preferably formed under the first layer (layer containing silicon and germanium as an additive material) of the first member. This is because a high-quality first layer can be obtained by forming it after a silicon layer is formed on the separation layer rather than by directly forming the first layer on the separation layer.

In the above manufacturing method, the separation layer is formed on the first member first, and then, the first and second layers and the insulating layer are sequentially formed. However, the separation layer may be formed, e.g., after the first and second layers and the insulating layer are formed. For example, an ion-implanted layer to be used as a separation layer may be formed under the first layer by ion implantation including the step of implanting ions such as hydrogen ions into the first member with the first and second layers and the insulating layer formed thereon. As is known, many small cavities that are latently present in the ion-implanted layer coagulate upon annealing. This layer is called, e.g., a micro-cavity layer. As an ion species, nitrogen or rare gas ions can be used in addition to hydrogen ions. As an ion implantation method, e.g., plasma immersion ion implantation (described in, e.g., WO98/52216) can be employed.

In the above manufacturing method, germanium is preferably used as a material to be added to silicon to form the first layer. However, any other material can be added as long as it can form a layer having a lattice constant different from that of the silicon layer to be used as an active layer. In addition to germanium, e.g., Sb, As, or C can be applied to the present invention.

In the above manufacturing method, the separation step can be realized by various methods. It is preferable to employ a method of, e.g., injecting a fluid into the separation layer of the composite member formed by bonding and separating the composite member into two members by the fluid. As the fluid, in addition to a liquid such as water, a gas such as air can be employed. A technique that employs water or a mixture thereof as a fluid is known as a water jet method.

Preferred embodiments of the present invention will be described below.

[First Embodiment]

A semiconductor substrate (member) manufacturing method according to the first embodiment of the present invention will be described with reference to FIGS. 1A to 1E.

In the step (stacking step) shown in FIG. 1A, a first substrate (member) 10 having a porous layer 12 on a silicon substrate 11, a silicon layer 13 on the porous layer 12, a first layer (SiGe layer) 14 containing silicon and germanium (additive material) on the silicon layer 13, and a silicon layer 15 on the SiGe layer 14 is prepared.

First, the porous layer 12 is formed on the single-crystal silicon substrate 11 by anodizing. Anodizing can typically be done by filling an anodizing container having a platinum electrode pair with a solution containing hydrogen fluoride (HF), placing the silicon substrate 11 between the electrode pair, and supplying a current between the electrode pair. The porous layer 12 formed by this step is a layer having a fragile structure and functions as a separation layer later in the separation step.

A protective film such as an oxide film may be formed on the pore surfaces in the porous layer. Alternatively, a plurality of layers having different porosities may be formed by controlling the anodizing solution or current. For example, a first porous layer and a second porous layer having a lower porosity than the first porous layer may be formed sequentially from the single-crystal silicon substrate 11 side.

Then, the single-crystal silicon layer 13 is epitaxially grown on the porous layer 12 by CVD.

The growth conditions of the single-crystal silicon layer are as follows.

Carrier gas: $H_2$

The flow rate of hydrogen is preferably 15 to 45 liters/min and, typically, 30 liters/min.

Source gas: $SiH_2Cl_2$

The flow rate of the source gas is preferably 50 to 200 sccm and, typically, 100 sccm.

Chamber pressure

The chamber pressure is preferably 10 to 100 Torr and, typically, 80 Torr.

Growth temperature

The growth temperature is preferably 650° C. to 1,000° C. and, typically, 900° C.

Before growth of the single-crystal silicon layer, the porous layer surface is preferably annealed (pre-baked) in a hydrogen atmosphere. In pre-baking, the flow rate of hydrogen is preferably 15 to 45 liters/min (typically, 40 liters/min), the temperature is preferably 700° C. to 1,000° C. (typically, 950° C.), and the chamber pressure is preferably 10 to 760 Torr (typically, 80 Torr). The single-crystal silicon layer is also preferably grown at a low growth rate of 50 nm/min or less at the initial stage of growth.

As the first layer 14, a layer (SiGe layer: e.g., Ge=30%) containing silicon and germanium (additive material) is epitaxially grown on the single-crystal silicon layer 13 by CVD using lamp heating. Conditions for it are preferably as follows. The above-described pre-baking may be executed before the growth.

Carrier gas: $H_2$

The flow rate of $H_2$ is preferably 25 to 45 liters/min and, typically, 30 liters/min.

Source gas 1: $SiH_4$

The flow rate of $SiH_4$ is preferably 50 to 200 sccm and, typically, 100 sccm.

Source gas 2: 2% $GeH_4$

The flow rate of 2% $GeH_4$ is preferably 20 to 500 sccm and, typically, 300 sccm.

Chamber pressure

The chamber pressure is preferably 10 to 100 Torr and, typically, 100 Torr.

Temperature

The temperature is preferably 650° C. to 680° C.

Growth rate

The growth rate is preferably 10 to 50 nm/min.

A single-crystal silicon layer as the second layer 15 is epitaxially grown on the first layer (SiGe layer) 14 by CVD. Conditions for it are preferably as follows.

Growth conditions of the single-crystal silicon layer serving as the second layer 15 are as follows.

Carrier gas: $H_2$

The flow rate of hydrogen is preferably 15 to 45 liters/min and, typically, 30 liters/min.

Source gas: $SiH_4$

The flow rate of the source gas is preferably 50 to 500 sccm and, typically, 100 sccm.

Chamber pressure

The chamber pressure is preferably 10 to 100 Torr and, typically, 80 Torr.

Growth temperature

The growth temperature is preferably 650° C. to 1,000° C., and typically, 900° C.

Growth rate

The growth rate is preferably 10 to 500 nm/min.

The above-described pre-baking may be executed before the growth. If a sample is extracted from the CVD apparatus for each step, a spontaneous oxide film formed on the surface may be removed by dipping it into a diluted HF solution before the next step.

With the above step, the first substrate (member) 10 schematically shown in FIG. 1A is obtained. The silicon layer 13, first layer (SiGe layer) 14, and second layer (silicon layer) 15 may be formed in a single step (e.g., the CVD step) by gradually or stepwise changing the Ge concentration (and the concentration of another gas) or other conditions, instead of using the multiple steps described above.

Figure 1B:
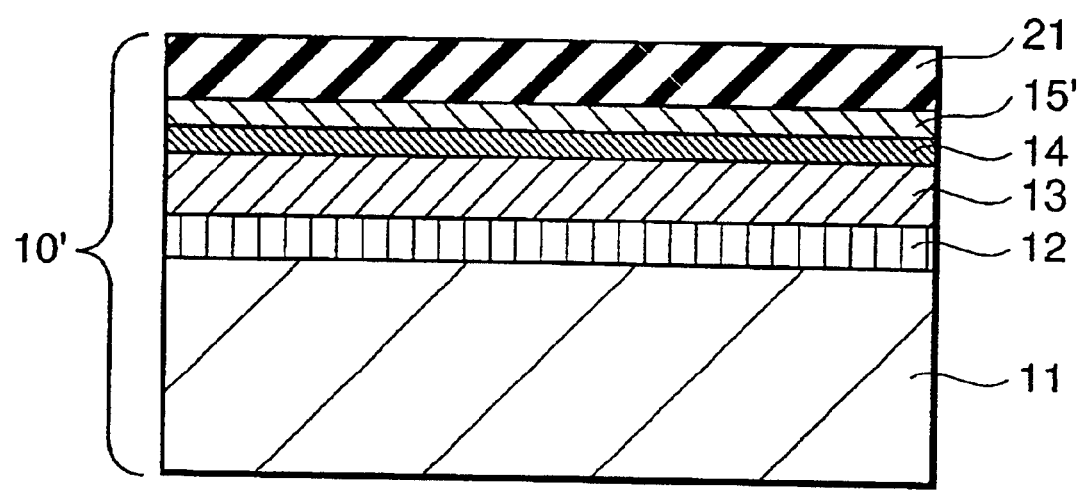
FIG. 1B is a sectional view showing the insulating layer forming step of the first and second embodiments.

Next to the step shown in FIG. 1A, in the step (insulating layer forming step) shown in FIG. 1B, an insulating layer 21 is formed on the surface of the first substrate 10 shown in FIG. 1A. In this step, typically, an insulating film (in this case, an $SiO_2$ film) is formed by thermally oxidizing the second layer (single-crystal silicon layer) 15 on the surface of the first substrate 10 shown in FIG. 1A by thermal oxidation. Reference numeral 15' denotes a thermally oxidized second layer. When thermal oxidation is used, the insulating layer 21 having a much higher quality than a buried oxide film by SIMOX can be formed. The insulating layer 21 may be formed not by thermal oxidation but by CVD. In this case as well, the insulating layer 21 having a higher quality than by SIMOX using oxygen ion implantation can be formed. Formation of the insulating layer is not indispensable. The insulating layer may be formed on the surface of the second substrate, as will be described later. If the second substrate is made of an insulating material such as transparent glass, the insulating layer need not be formed.

The insulating layer 21 functions as a buried insulating film (buried oxide film) later. The insulating layer 21 also functions as a diffusion stopper in the step of diffusing germanium (additive material) from the first layer 14 to the second layer 15', which is executed later. Since the insulating layer 21 formed by thermal oxidation or the insulating layer 21 formed on the surface layer of the substrate by CVD is a fine film containing few defects and therefore acts as a satisfactory diffusion stopper. A buried oxide film by SIMOX can also function as a diffusion stopper. However, since the buried oxide film by SIMOX has many defects, germanium may diffuse into the substrate through the defects. The defects here include a region where no satisfactory $SiO_2$ was formed in the presence of foreign substances on the substrate surface that received oxygen ions.

Figure 1C:
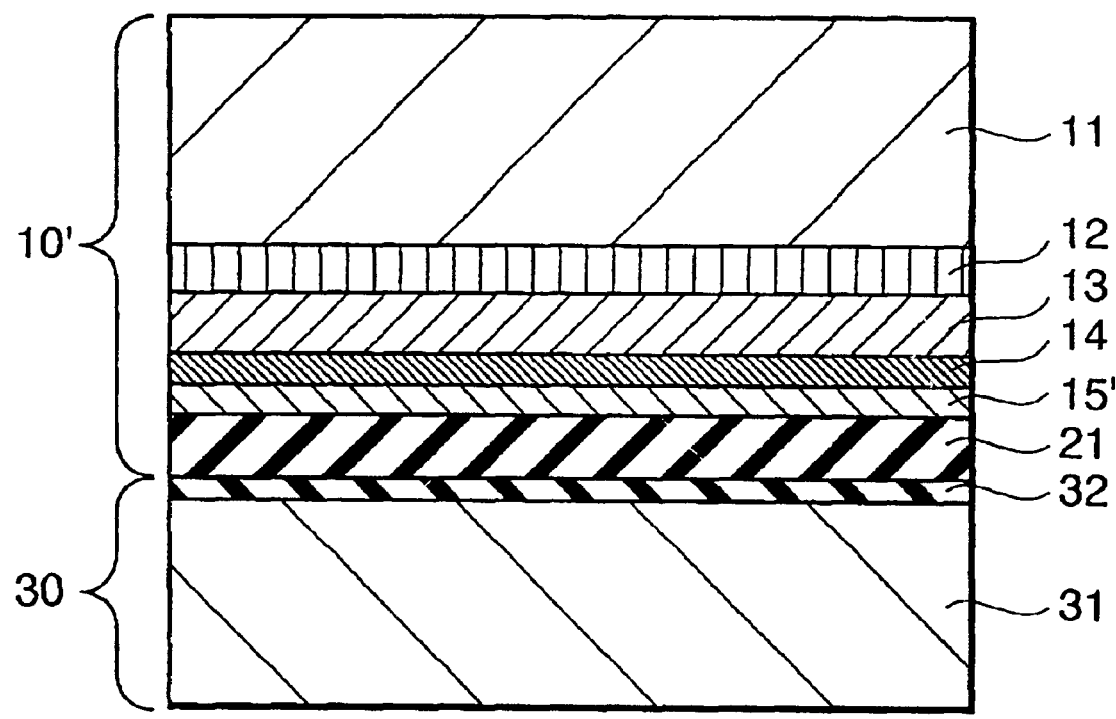
FIG. 1C is a sectional view showing the bonding step (preprocessing of the transfer step) of the first and second embodiments.

Next to the step shown in FIG. 1B, in the step (bonding step) shown in FIG. 1C, a second substrate (member) 30 is bonded to the insulating layer 21 side of a first substrate (member) 10' having the insulating layer 21. The first substrate 10' and second substrate 30 may be only simply bonded to each other. Alternatively, the two substrates may be brought into tight contact with each other and then subjected to anodic bonding or annealing to firmly bond them. The second substrate 30 is typically a substrate prepared by forming an insulating layer 32 such as an $SiO_2$ layer on the surface of a silicon substrate 31. The insulating layer 32 is not indispensable. The second substrate 30 need not always be formed from a silicon substrate. For example, the second substrate 30 may be a glass substrate.

Figure 1D:
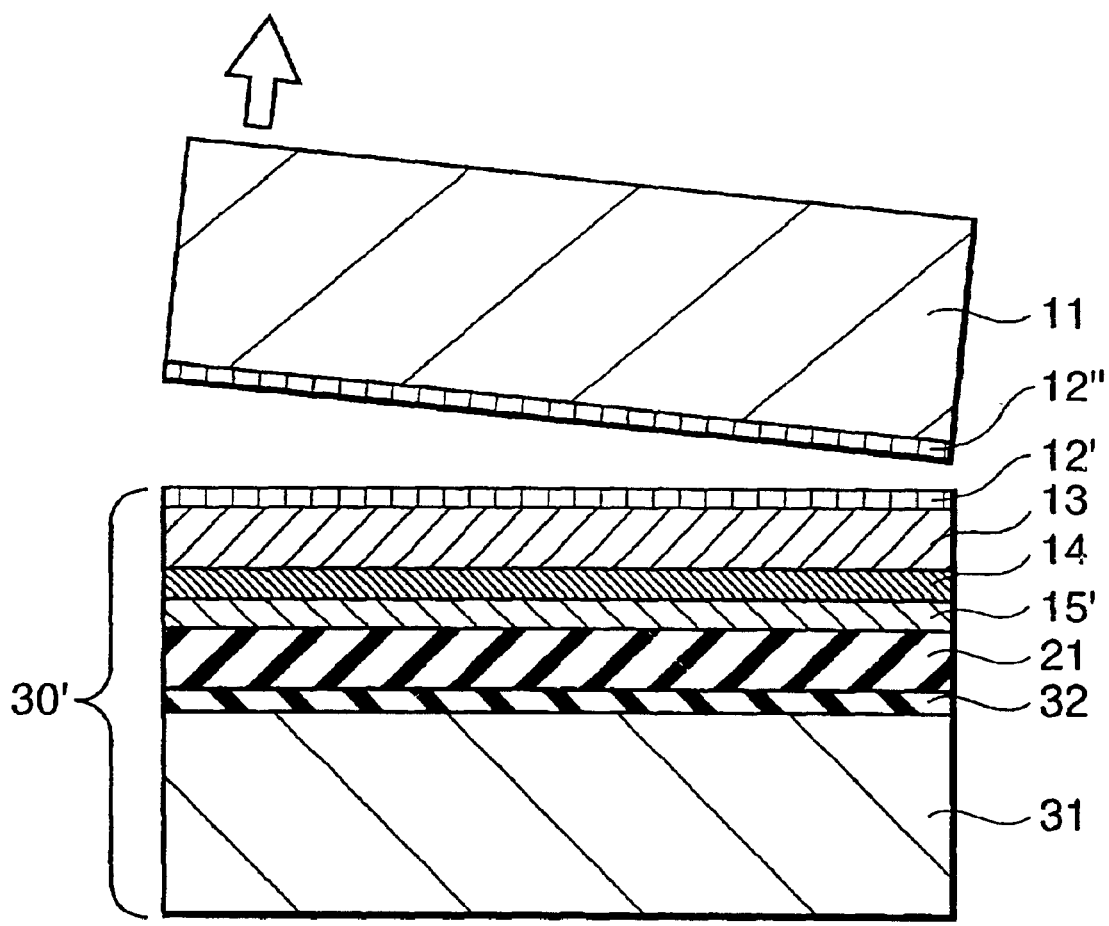
FIG. 1D is a sectional view showing the separation step (post-processing of the transfer step) of the first and second embodiments.

Next to the step shown in FIG. 1C, in the step (separation step) shown in FIG. 1D, the substrate (bonded substrate stack) formed by bonding is separated into two substrates at the separation layer 12. That is, the transfer step is executed by the bonding step shown in FIG. 1C and the separation step shown in FIG. 1D. The separation step can be executed by, e.g., injecting a fluid into the separation layer 12 while rotating the bonded substrate stack about its axis. Reference numerals 12' and 12" schematically denote porous layers remaining on the two separated substrates.

Instead of the separation method using a fluid such as a liquid or a gas, a separation method using tensile, compression, or shearing stress may be employed. Alternatively, both methods may be combined. When the porous layer 12' remains on a separated second substrate 30', the porous layer is preferably removed by etching, polishing, grinding, or annealing in a reducing atmosphere containing hydrogen. If no or few residue is present, or the residue poses no problem in the post-processing, the removal step need not always be executed.

Figure 1E:
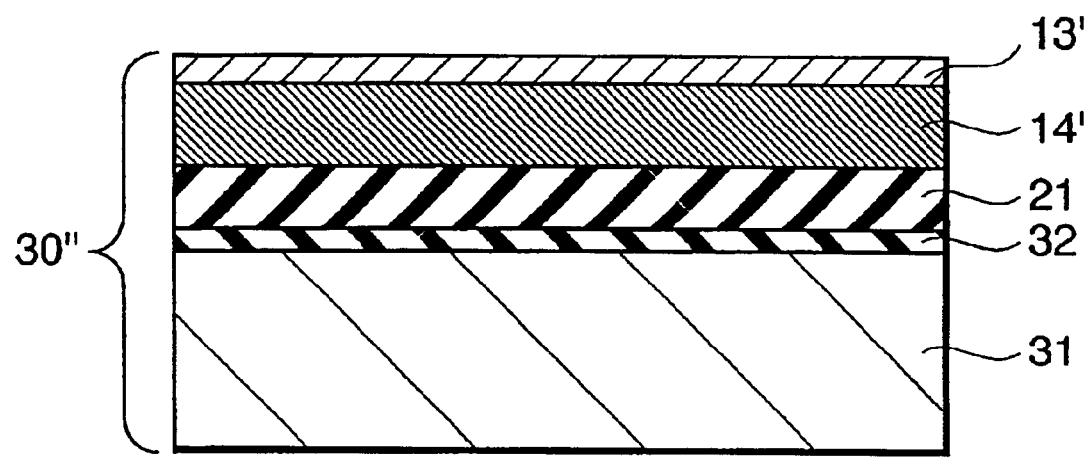
FIG. 1E is a sectional view showing the diffusion step of the first embodiment.

Next to the step shown in FIG. 1D, in the step (diffusion step) shown in FIG. 1E, annealing and, typically, hydrogen annealing is executed for the separated second substrate 30'. This annealing is executed at a temperature capable of diffusing germanium (additive material) in the first layer 14 and, typically, at 1,000° C. or more. With this annealing, germanium in the first layer 14 is diffused until it partially reaches the insulating layer 21, thereby forming an insulating layer/SiGe layer interface. As described above, the insulating layer 21 functions as a stopper that suppresses diffusion of germanium. Hence, germanium is rarely diffused into the substrate through the insulating layer 21. This annealing is controlled such that the germanium in the first layer 14 partially reaches the insulating layer 21 while a silicon layer 13' substantially containing no germanium remains at a portion with a predetermined thickness (part of the original silicon layer 21) from the surface of a semiconductor substrate 30" to be manufactured. The remaining silicon layer 13' is a strained silicon layer because its lattice constant is different from that of an SiGe layer 14' formed under the silicon layer 13'.

Annealing is preferably executed at a hydrogen flow rate of 10 liters/min, a temperature of 900° C. to 1,200° C., and atmospheric pressure or less.

The thickness of the silicon layer 13' is preferably 2 to 200 nm and, more preferably, 2 to 50 nm. The thickness of the SiGe layer 14' is preferably 2 to 100 nm and, more preferably, 5 to 50 nm. The concentration of Ge is preferably 5% to 40% and, more preferably, 15% to 30%.

When a circuit element is formed using the strained silicon layer 13', a device with a high speed and low power consumption can be obtained. Circuit element formation (semiconductor device manufacturing) will be described later. The surface may be planarized by polishing or hydrogen annealing, as needed.

[Second Embodiment]

For the steps shown in FIGS. 1A to 1E, this embodiment is the same as in the first embodiment. Characteristic features of this embodiment, which are different from the first embodiment, will be described below with reference to FIGS. 2A and 2B.

Figure 2A:
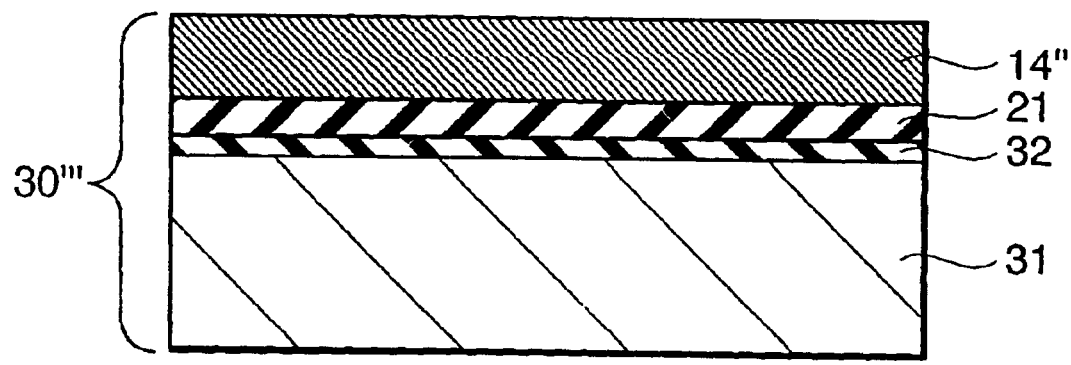
FIG. 2A is a sectional view showing the diffusion step of the second embodiment.

Next to the step (separation step) in FIG. 1D, in the step (diffusion step) shown in FIG. 2A, annealing and, typically, hydrogen annealing is executed for a separated second substrate 30'. This annealing is executed at a temperature capable of diffusing germanium (additive material) in a first layer 14 and, typically, at 1,000° C. or more. In this embodiment, with this annealing, germanium (additive material) in the first layer 14 is diffused into an entire silicon layer 15' and an entire second layer 13, thereby forming a layer (SiGe layer) 14" containing silicon and germanium on an insulating layer 21. Typically, annealing is executed such that the germanium concentration in the SiGe layer 14" becomes almost uniform. According to this embodiment, the concentration of germanium (additive material) in the surface layer of the second substrate 30' after annealing can easily be accurately controlled. In addition, the concentration distribution of germanium in the planar direction can easily be uniformed (flattened). The insulating layer 21 functions as a stopper for suppressing diffusion of germanium, as in the first embodiment.

Figure 2B:
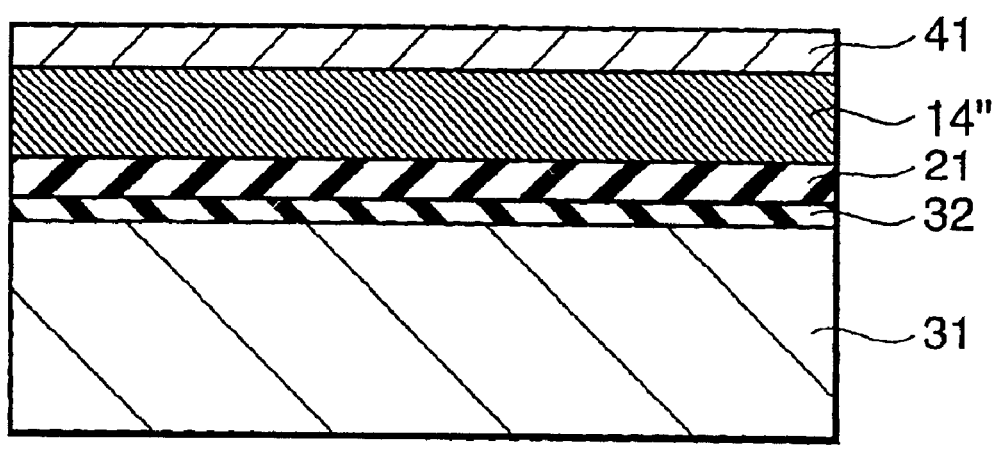
FIG. 2B is a sectional view showing the growing step of the second embodiment.

Next to the step shown in FIG. 2A, in the step (growing step) shown in FIG. 2B, a single-crystal silicon layer 41 is grown on the SiGe layer 14" of a second substrate 30'" by CVD. The single-crystal silicon layer 41 thus formed is a strained silicon layer because it has a lattice constant different from that of the underlying SiGe layer 14". According to this embodiment, the concentration of germanium in the SiGe layer 14" near the interface between the strained silicon layer 41 and the SiGe layer 14" can easily be accurately controlled. In addition, the concentration distribution at the interface can be uniformed (flattened). Hence, the strain of the strained silicon layer 41 formed on the SiGe layer 14" can easily be controlled, so a high-quality strained silicon layer 41 can be obtained.

The growth conditions of the single-crystal silicon layer 41 are as follows.

Carrier gas: $H_2$

The flow rate of $H_2$ is preferably 15 to 45 liters/min and, typically, 20 liters/min.

Source gas: $SiH_2Cl_2$

The flow rate of $SiH_2Cl_2$ is preferably 10 to 500 sccm and, typically, 100 sccm. $SiH_2$ may be used as the source gas. In this case, the flow rate is preferably 10 to 500 sccm and, typically, 50 sccm.

Chamber pressure

The chamber pressure is preferably 10 to 760 Torr and, typically, 80 Torr.

Temperature

The temperature is preferably 650° C. to 1,000° C. and, typically, 900° C.

Before growth, pre-baking is preferably performed. As pre-baking conditions, the temperature is preferably 850° C. to 1,000° C. (typically, 950° C.), the flow rate of hydrogen is preferably 15 to 50 liters/min (typically, 30 liters/min), and the pressure is preferably 10 to 760 Torr (typically, 80 Torr). The pre-baking step may be omitted.

When a circuit element is formed using the strained silicon layer 41, a device with a high speed and low power consumption can be obtained. Circuit element formation (semiconductor device manufacturing) will be described later.

In the above method, next to the step (diffusion step) shown in FIG. 2A, the step (growing step) shown in FIG. 2B is executed. However, the surface of the SiGe layer 14" may be thermally oxidized, and then, the thermal oxide film may be removed simultaneously with the diffusion step or between the diffusion step and the growing step. In this case, in thermally oxidizing the SiGe layer 14", a thermal oxide film is formed by bonding between silicon atoms on the surface of the SiGe layer 14" and oxygen atoms supplied from the vapor phase to the substrate, and on the other hand, germanium atoms are pressed out from the thermal oxide film into the substrate. For this reason, the germanium concentration in the SiGe layer 14" can be increased. At the same time, the SiGe layer 14" may be thinned out.

In this embodiment, since the single-crystal silicon layer 41 is newly formed on the SiGe layer 14" in the step (growing step) shown in FIG. 2B, the single-crystal silicon layer 13 need not always be formed before formation of the first layer (SiGe layer) 14 in the step (stacking step) shown in FIG. 1A. However, when the single-crystal silicon layer 13 is formed in the step shown in FIG. 1A, a high-quality first layer 14 can be formed on the silicon layer 13. The surface may be planarized by polishing or hydrogen annealing, as needed.

[Third Embodiment]

A semiconductor substrate (member) manufacturing method according to the third embodiment of the present invention will be described with reference to FIGS. 3A to 3F.

Figure 3A:
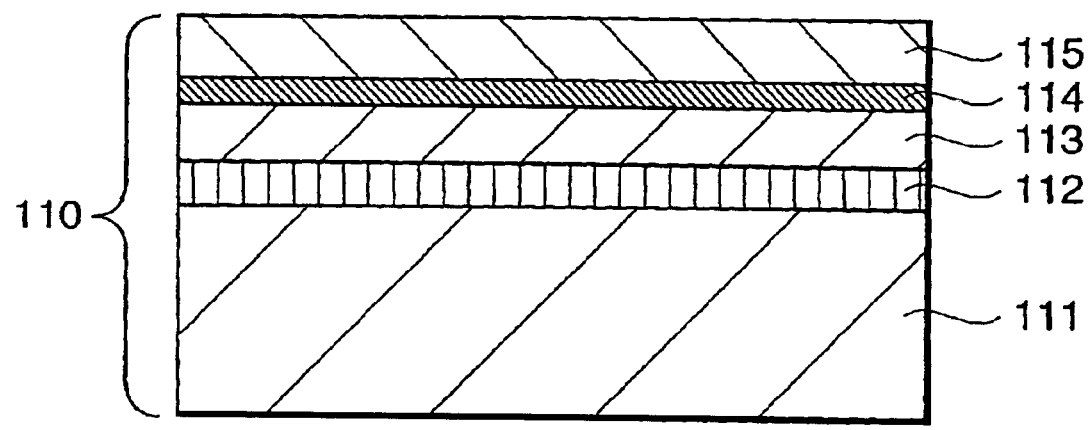
FIG. 3A is a sectional view showing the stacking step of the third and fourth embodiments.

In the step (stacking step) shown in FIG. 3A, a first substrate (member) 110 having a porous layer 112 on a silicon substrate 111, preferably a silicon layer 113 on the porous layer 112, a first layer (SiGe layer) 114 containing silicon and germanium (additive material) on the silicon layer 113, and a silicon layer 115 on the SiGe layer 114 is prepared.

First, the porous layer 112 is formed on the single-crystal silicon substrate 111 by anodizing. Anodizing can typically be done by filling an anodizing container having a platinum electrode pair with a solution containing hydrogen fluoride (HF), placing the silicon substrate 111 between the electrode pair, and supplying a current between the electrode pair. The porous layer 112 formed by this step is a layer having a fragile structure and functions as a separation layer later in the separation step.

Then, the single-crystal silicon layer 113 is epitaxially grown on the porous layer 112 by CVD.

The growth conditions of the single-crystal silicon layer are as follows.

Carrier gas: $H_2$
The flow rate of hydrogen is preferably 15 to 45 liters/min and, typically, 30 liters/min.

Source gas: $SiH_2Cl_2$
The flow rate of the source gas is preferably 50 to 200 sccm and, typically, 100 sccm.

Chamber pressure
The chamber pressure is preferably 10 to 100 Torr and, typically, 80 Torr.

Growth temperature
The growth temperature is preferably 650° C. to 1,000° C. and, typically, 900° C.

Before growth of the single-crystal silicon layer, the porous layer surface is preferably annealed (pre-baked) in a hydrogen atmosphere. In pre-baking, the flow rate of hydrogen is preferably 15 to 45 liters/min (typically, 40 liters/min), the temperature is preferably 700° C. to 1,000° C. (typically, 950° C.), and the chamber pressure is preferably 10 to 760 Torr (typically, 80 Torr). The single-crystal silicon layer is also preferably grown at a low growth rate of 50 nm/min or less at the initial stage of growth.

The single-crystal silicon layer 113 is not always necessary. However, when it is formed, a high-quality first layer 114 can be obtained.

As the first layer 114, a layer (SiGe layer: e.g., Ge=30%) containing silicon and germanium (additive material) is epitaxially grown on the single-crystal silicon layer 113 by CVD using lamp heating. Conditions for it are preferably as follows.

Carrier gas: $H_2$
The flow rate of $H_2$ is preferably 25 to 45 liters/min and, typically, 30 liters/min.

Source gas 1: $SiH_4$
The flow rate of $SiH_4$ is preferably 50 to 200 sccm and, typically, 100 sccm.

Source gas 2: 2% $GeH_4$
The flow rate of 2% $GeH_4$ is preferably 20 to 500 sccm and, typically, 300 sccm.

Chamber pressure
The chamber pressure is preferably 10 to 100 Torr and, typically, 100 Torr.

Temperature
The temperature is preferably 650° C. to 680° C.

Growth rate
The growth rate is preferably 10 to 50 nm/min.

A single-crystal silicon layer as the second layer 115 is epitaxially grown on the first layer (SiGe layer) 114 by CVD. Conditions for it are preferably as follows.

Growth conditions of the single-crystal silicon layer serving as the second layer 115 are as follows.

Carrier gas: $H_2$
The flow rate of hydrogen is preferably 15 to 45 liters/min and, typically, 30 liters/min.

Source gas: $SiH_4$
The flow rate of the source gas is preferably 50 to 500 sccm and, typically, 100 sccm.

Chamber pressure
The chamber pressure is preferably 10 to 100 Torr and, typically, 80 Torr.

Growth temperature
The growth temperature is preferably 650° C. to 1,000° C., and typically, 900° C.

Growth rate
The growth rate is preferably 10 to 500 nm/min.

The above-described pre-baking may be executed before the growth. If a sample is extracted from the CVD apparatus for each step, a spontaneous oxide film formed on the surface may be removed by dipping it into a diluted HF solution before the next step.

With the above step, the first substrate (member) 110 schematically shown in FIG. 3A is obtained. The silicon layer 113, first layer (SiGe layer) 114, and second layer (silicon layer) 115 may be formed in a single step (e.g., the CVD step) by gradually or stepwise changing the Ge concentration (and the concentration of another gas) or other conditions, instead of using the multiple steps described above.

Figure 3B:
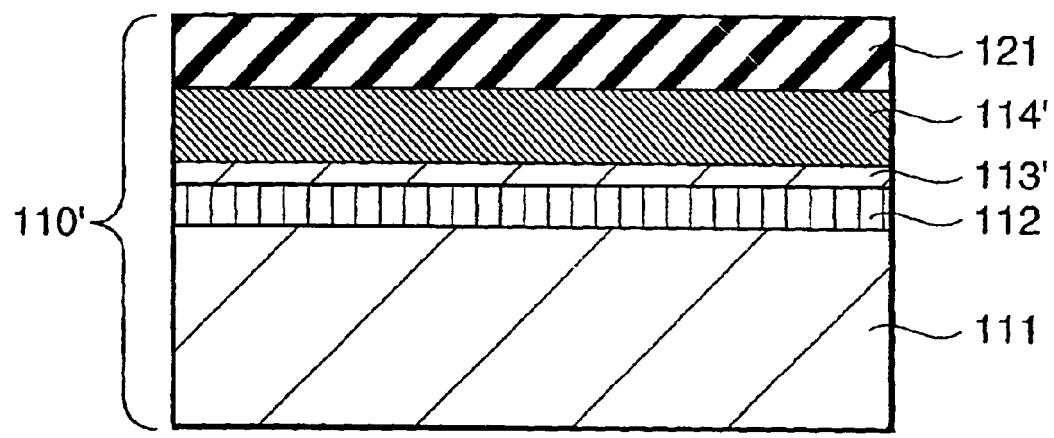
FIG. 3B is a sectional view showing the insulating layer forming step and first diffusion step of the third and fourth embodiments.

Next to the step shown in FIG. 3A, in the step (insulating layer forming step/first diffusion step) shown in FIG. 3B, an insulating layer 121 is formed on the surface of the first substrate 110 shown in FIG. 3A. by thermal oxidation. At the same time, germanium (additive material) contained in a first layer 114' is diffused into the second layer (silicon layer) 115 by annealing accompanying the thermal oxidation. This annealing is executed at a temperature capable of diffusing germanium and, typically, at 1,000° C. or more. This annealing is controlled such that the germanium (additive material) in the first layer 114 partially reaches the insulating layer 121 simultaneously with diffusion to form an insulating layer/SiGe layer interface. Reference numerals 114' and 113' denote an SiGe layer and silicon layer after diffusion of germanium.

In the step shown in FIG. 3A, when the silicon layer 113 is formed before formation of the first layer 114, germanium also diffuses into the silicon layer 113.

As a characteristic feature of this embodiment, the thermal oxidation step and diffusion step are parallelly executed. However, the diffusion step may be executed after the thermal oxidation step (insulating layer forming step) (e.g., between the insulating layer forming step and the bonding step or between the bonding step and the separation step). In the first and second embodiments, the diffusion step is executed after the separation step.

Figure 3C:
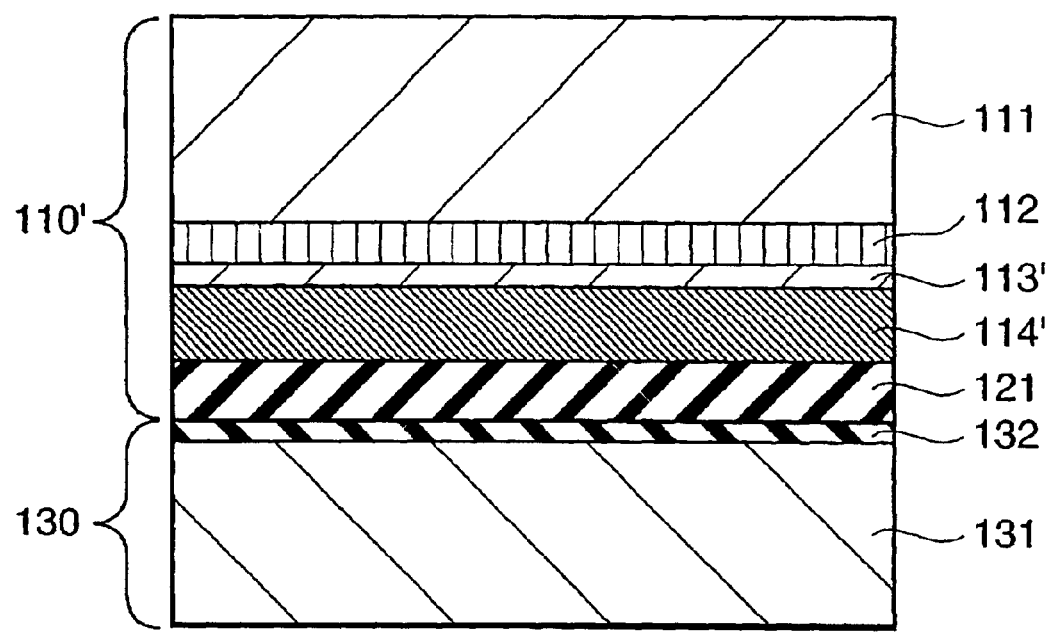
FIG. 3C is a sectional view showing the bonding step (preprocessing of the transfer step) of the third and fourth embodiments.

Next to the step shown in FIG. 3B, in the step (bonding step) shown in FIG. 3C, a second substrate (member) 130 is bonded to the insulating layer 121 side of a first substrate (member) 110' having the insulating layer 121. The first substrate 110' and second substrate 130 may be only simply bonded to each other. Alternatively, the two substrates may be brought into tight contact with each other and then subjected to anodic bonding or annealing to firmly bond them. The second substrate 130 is typically a substrate prepared by forming an insulating layer 132 such as an $SiO_2$ layer on the surface of a silicon substrate 131. The insulating layer 132 is not indispensable. The second substrate 130 need not always be formed from a silicon substrate. For example, the second substrate 130 may be a glass substrate.

Figure 3D:
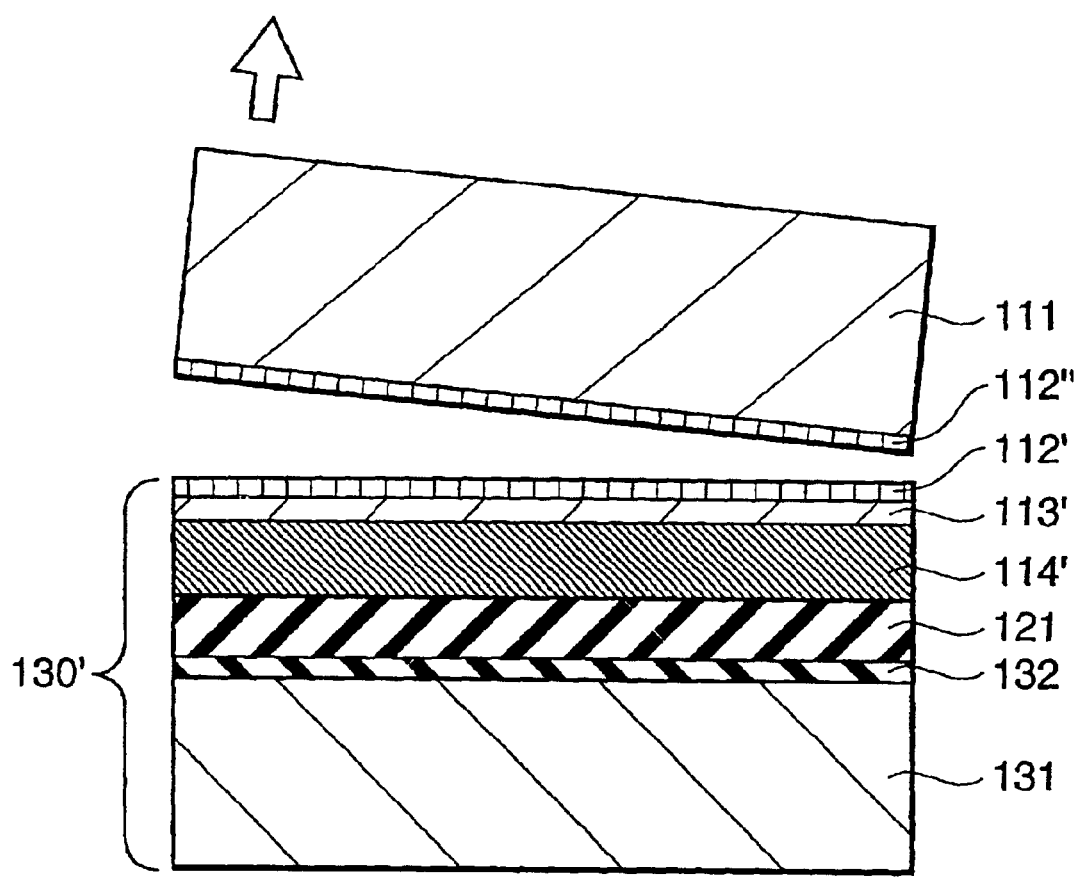
FIG. 3D is a sectional view showing the separation step (post-processing of the transfer step) of the third and fourth embodiments.

Next to the step shown in FIG. 3C, in the step (separation step) shown in FIG. 3D, the substrate (bonded substrate stack) formed by bonding is separated into two substrates at the separation layer 112. That is the transfer step is executed by the bonding step shown in FIG. 3C and the separation step shown in FIG. 3D. The separation step can be executed by, e.g., injecting a fluid into the separation layer 112 while rotating the bonded substrate stack about its axis. Reference numerals 112' and 112" schematically denote porous layers remaining on the two separated substrates. In this separation step, when the porous layer remains on the separated second substrate 130', the remaining porous layer 112' may be removed by etching or the like.

Figure 3E:
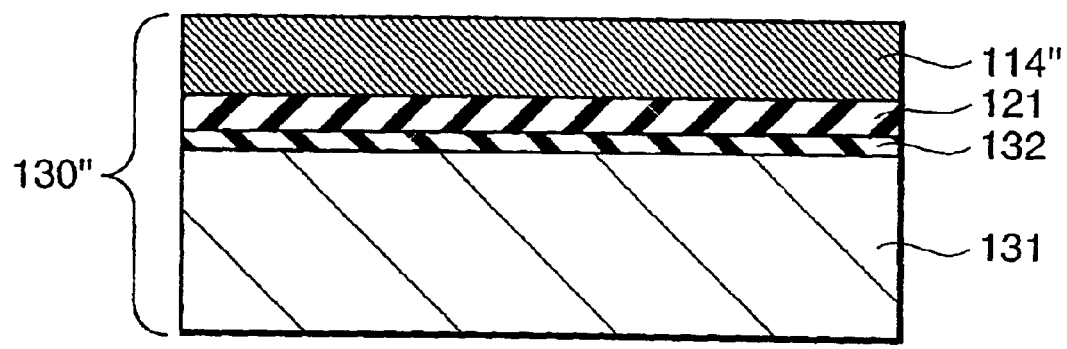
FIG. 3E is a sectional view showing the second diffusion step of the third and fourth embodiments.

In the step (second diffusion step) shown in FIG. 3E, which is arbitrarily executed next to the step shown in FIG. 3D, annealing and, typically, hydrogen annealing is executed for the separated second substrate 130'. This annealing is executed at a temperature capable of further diffusing germanium (additive material) in the SiGe layer 114' to improve the quality of the SiGe layer 114' (e.g., to uniform the germanium concentration or to remove lattice defects) and, typically, at 1,000° C. or more.

When the silicon layer 113 is formed before formation of the first layer 114 in the step shown in FIG. 3A, this annealing is typically controlled such that germanium diffuses into the entire silicon layer 113. However, the annealing may be controlled such that a silicon layer substantially containing no germanium remains at a portion with a predetermined thickness from the surface layer (the original silicon layer 113) of the second substrate 130", as in the first embodiment.

The annealing for converting the entire upper portion of the insulating layer 121 into the SiGe layer 114" is preferably executed in, e.g., a hydrogen atmosphere at a temperature of 900° C. to 1,200° C. and, more preferably, 1,000° C. to 1,100° C., an atmospheric pressure or less, and a hydrogen flow rate of 2 to 20 liters/min.

Figure 3F:
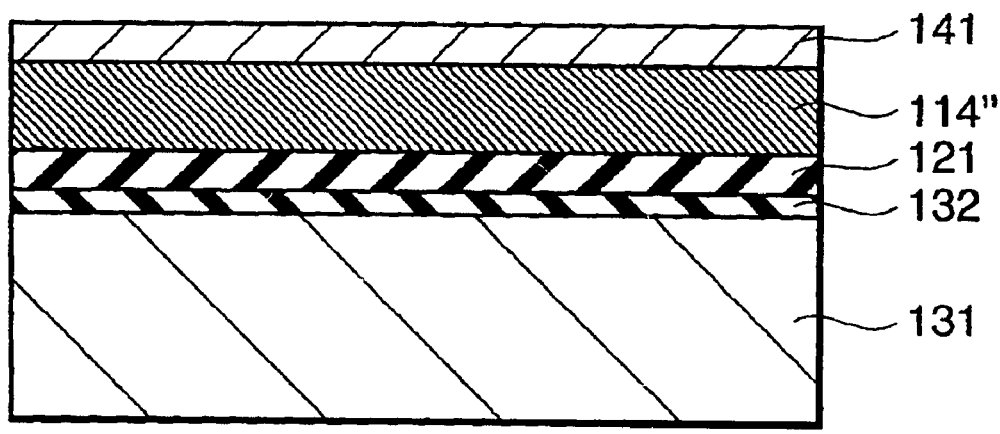
FIG. 3F is a sectional view showing the growing step of the third embodiment.

Next to the step shown in FIG. 3E, in the step (growing step) shown in FIG. 3F, a single-crystal silicon layer 141 is grown on the SiGe layer 114" of the second substrate 130" by CVD. The thus formed single-crystal silicon layer 141 is a strained silicon layer because it has a lattice constant different from that of the underlying SiGe layer 114".

When a circuit element is formed using the strained silicon layer 141, a device with a high speed and low power consumption can be obtained. Circuit element formation (semiconductor device manufacturing) will be described later. The surface may be planarized by polishing or hydrogen annealing, as needed.

[Fourth Embodiment]

For the steps shown in FIGS. 3A to 3D or FIGS. 3A to 3E, this embodiment is the same as in the third embodiment. Characteristic features of this embodiment, which are different from the third embodiment, will be described below with reference to FIGS. 4A to 4C.

Figure 4A:
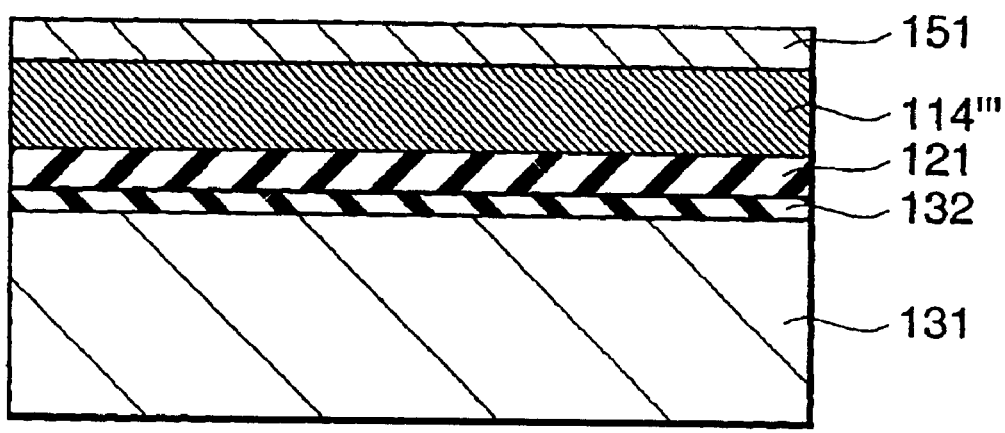
FIG. 4A is a sectional view showing the thermal oxidation step of the fourth embodiment.

Next to the step (separation step) shown in FIG. 3D or the step (second diffusion step) shown in FIG. 3E, in the step (thermal oxidation step) shown in FIG. 4A, the surface of a second substrate 130' or 130" shown in FIG. 3D or 3E is thermally oxidized. In this thermal oxidation step, a thermal oxide film 151 is formed by bonding between silicon atoms on the surface of an SiGe layer 14''' and oxygen atoms supplied from the vapor phase to the substrate. At this time, germanium atoms are pressed out from the thermal oxide film 151 into the substrate. For this reason, the germanium concentration in the SiGe layer 14''' increases. At the same time, the SiGe layer 14''' is thinned out.

Figure 4B:
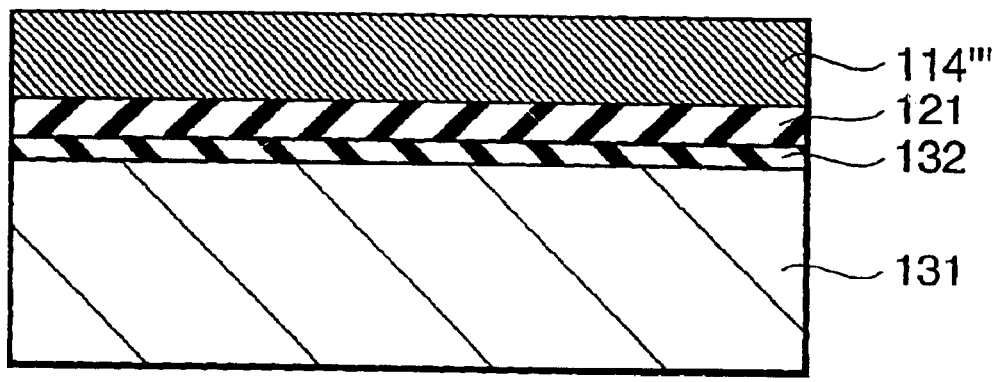
FIG. 4B is a sectional view showing the removal step of the fourth embodiment.

Next to the step shown in FIG. 4A, in the step (oxide film removal step) shown in FIG. 4B, the thermal oxide film formed on the SiGe layer 114''' on the second substrate by thermal oxidation is removed to expose the SiGe layer 114'''.

Figure 4C:
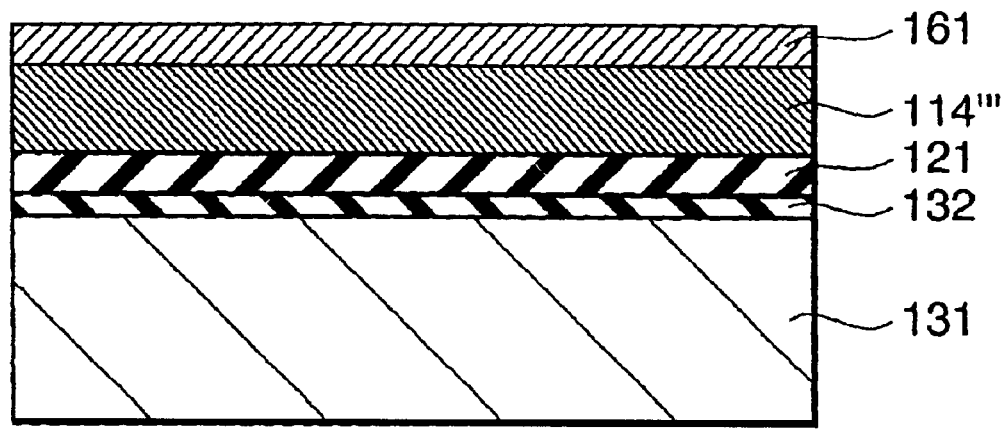
FIG. 4C is a sectional view showing the growing step of the fourth embodiment.

Next to the step shown in FIG. 4B, in the step (growing step) shown in FIG. 4C, a single-crystal silicon layer 161 is grown on the SiGe layer 114''' by CVD. The thus formed single-crystal silicon layer 161 is a strained silicon layer because it has a lattice constant different from that of the underlying SiGe layer 114'''.

[Example of Semiconductor Device]

A semiconductor device (device) using a semiconductor substrate that can be manufactured by the above substrate manufacturing method and a manufacturing method thereof will be described next with reference to FIGS. 5A to 5D.

A semiconductor substrate is manufactured using any one of the semiconductor substrate (member) manufacturing methods explained as the first to fourth embodiments. As described above, this semiconductor substrate has an SiGe layer on a buried oxide film (insulating film) and a strained Si layer on it. This substrate has a silicon layer on an insulating film and, therefore, can be regarded as a kind of SOI substrate. However, a semiconductor substrate (to be referred to as a strained SOI substrate hereinafter) having a structure of strained Si layer/SiGe layer/insulating layer has received a great deal of attention because it can be used to obtain a device with a higher speed and lower power consumption than a normal SOI substrate having a structure of single-crystal silicon layer/insulating layer. This is because a strained Si layer is more advantageous than an Si layer without any strain.

Figure 5A:
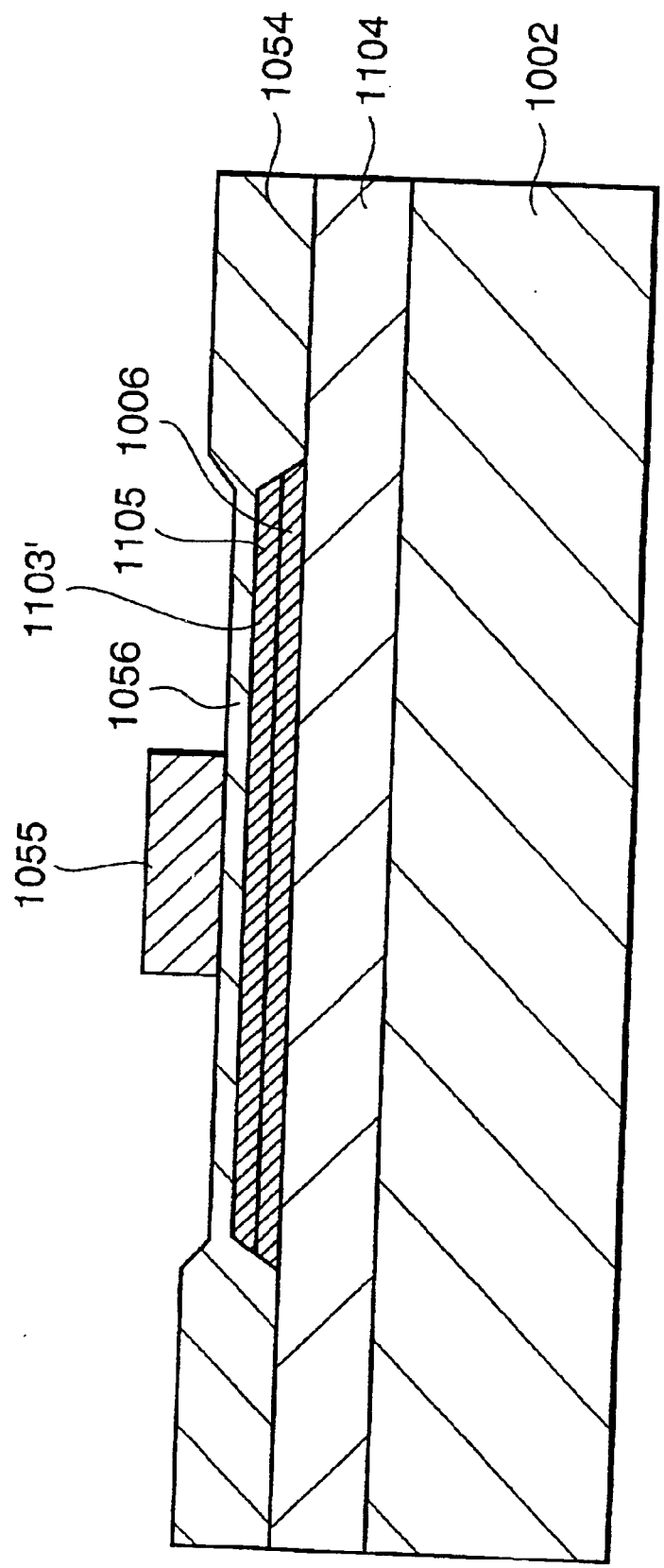
FIGS. 5A to 5D are views showing a semiconductor device and a manufacturing method thereof.

In the step shown in FIG. 5A, an active region 1103' and element isolation region 1054 are formed on the prepared strained SOI substrate. More specifically, the active region 1103' and element isolation region 1054 can be formed by, e.g., a method of pattering an SiGe layer 1106 and strained Si layer 1105 on a buried insulating film 1104 into an island shape, LOCOS, or trench method.

A gate insulating film 1056 is formed on the surface of the strained Si layer 1105. As the material of the gate insulating film 1056, e.g., silicon oxide, silicon nitride, silicon oxynitride, aluminum oxide, tantalum oxide, hafnium oxide, titanium oxide, scandium oxide, yttrium oxide, gadolinium oxide, lanthanum oxide, zirconium oxide, or mixed glass thereof is preferably used. The gate insulating film 1056 can be formed by, e.g., oxidizing the surface of the strained Si layer 1105 or depositing an insulating substance on the strained Si layer 1105 by CVD or PVD.

A gate electrode 1055 is formed on the gate insulating film 1056. The gate electrode 1055 can be formed from, e.g., polysilicon doped with a p- or n-type impurity, a metal such as tungsten, molybdenum, titanium, tantalum, aluminum, or copper or an alloy containing at least one of them, a metal silicide such as molybdenum silicide, tungsten silicide, or cobalt silicide, or a metal nitride such as titanium nitride, tungsten nitride, or tantalum nitride. The gate insulating film 1056 may be formed by stacking a plurality of layers made of different materials such as a polycide gate. The gate electrode 1055 may be formed by, e.g., a method called salicide (self-align silicide), a method called a damascene gate process, or any other method. With the above step, the structure shown in FIG. 5A is obtained.

Figure 5B:
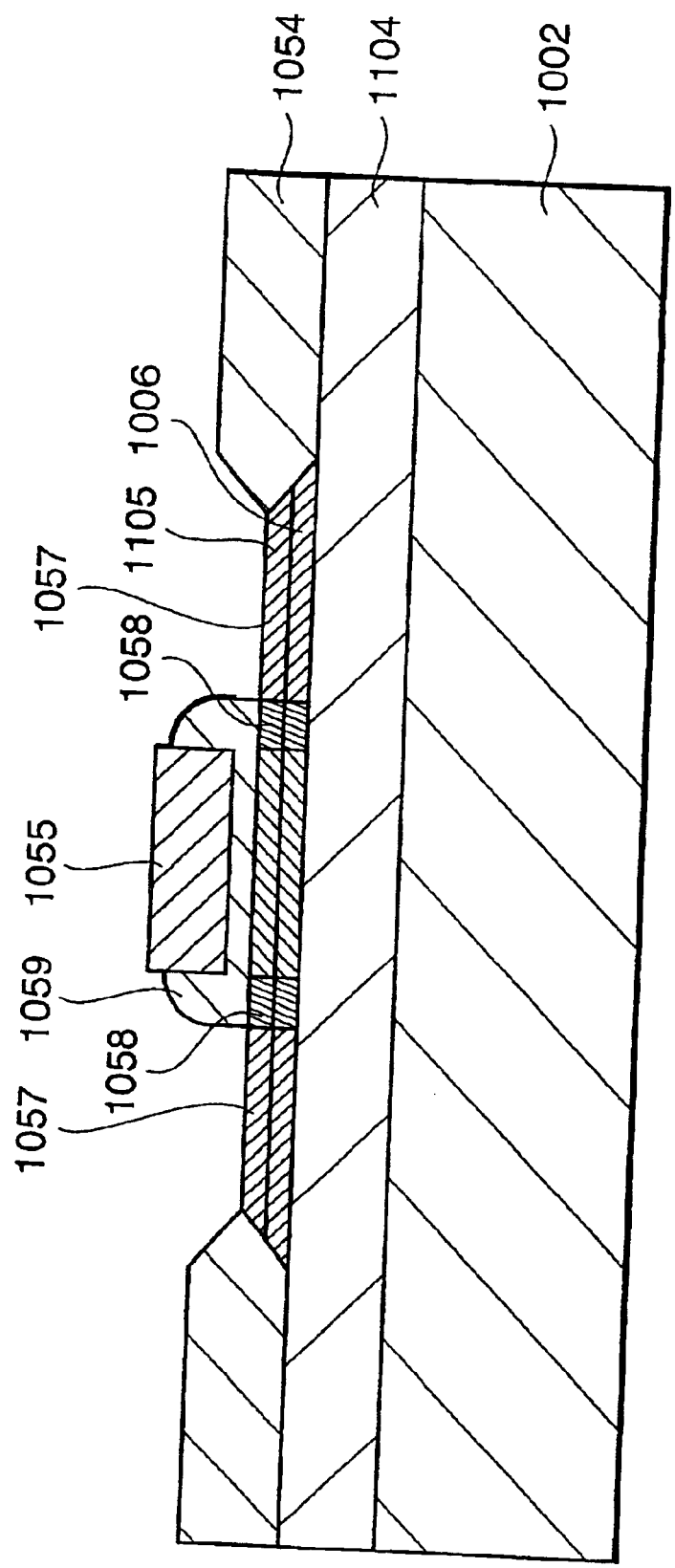

In the step shown in FIG. 5B, an n-type impurity such as phosphorus, arsenic, or antimony or a p-type impurity such as boron is doped into the active region 1103', thereby forming relatively lightly doped source and drain regions 1058. The impurity can be doped by, e.g., ion implantation and annealing.

An insulating film is formed to cover the gate electrode 1055 and etched back to form a side wall 1059 on the side surface of the gate electrode 1055.

An impurity having the same conductivity type as described above is doped into the active region 1103' to form relatively heavily doped source and drain regions 1057. With the above step, the structure shown in FIG. 5B is obtained.

Figure 5C:
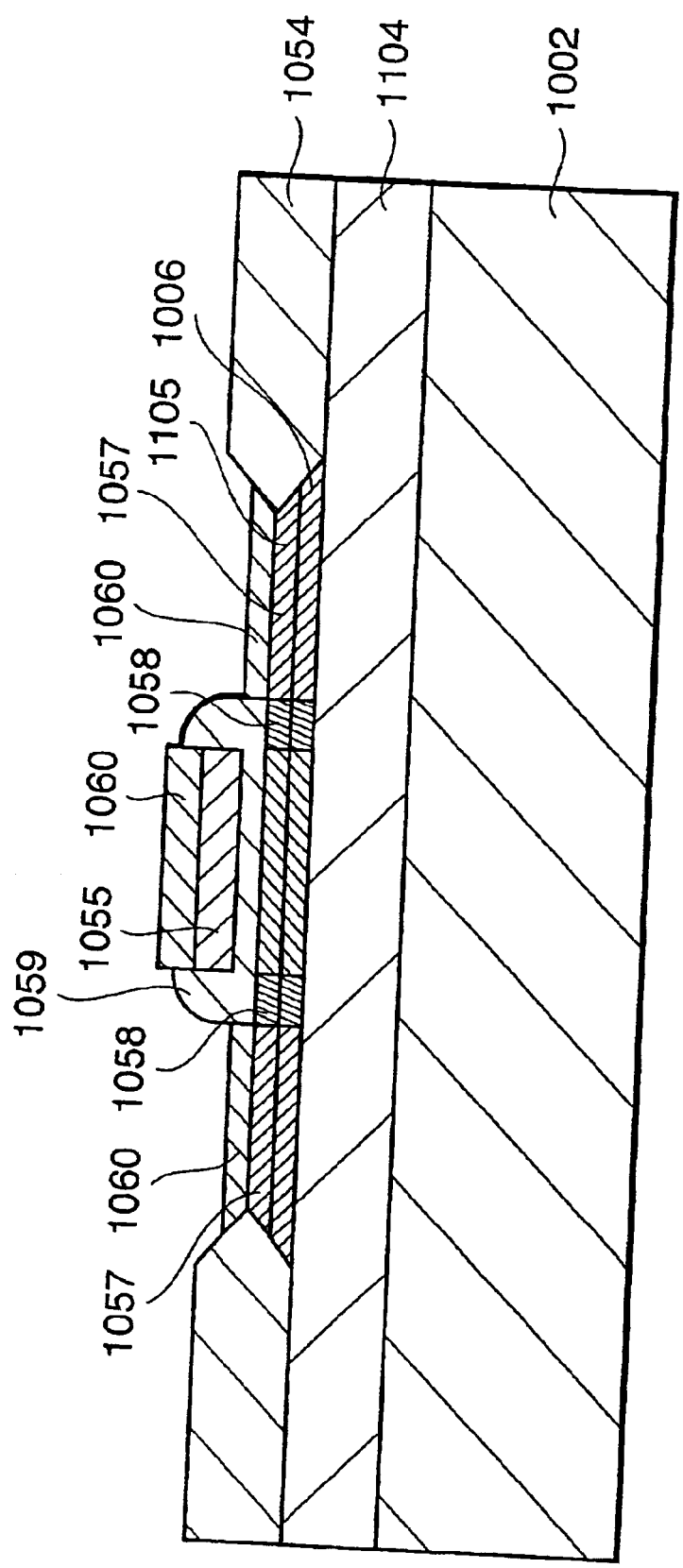

In the step shown in FIG. 5C, a metal silicide layer 1060 is formed on the upper surface of the gate electrode 1055 and on the upper surfaces of the source and drain regions 1057. As the material of the metal silicide layer 1060, e.g., nickel silicide, titanium silicide, cobalt silicide, molybdenum silicide, or tungsten silicide is preferably used. Such a silicide can be formed by depositing a metal to cover the upper surface of the gate electrode 1055 and the upper surfaces of the source and drain regions 1057, executing annealing to make the metal react with the underlying silicon layer, and removing unreacted metal portions using an etchant such as sulfuric acid. The surface of the silicide layer may be nitrided, as needed. With the above step, the structure shown in FIG. 5C is obtained.

Figure 5D:
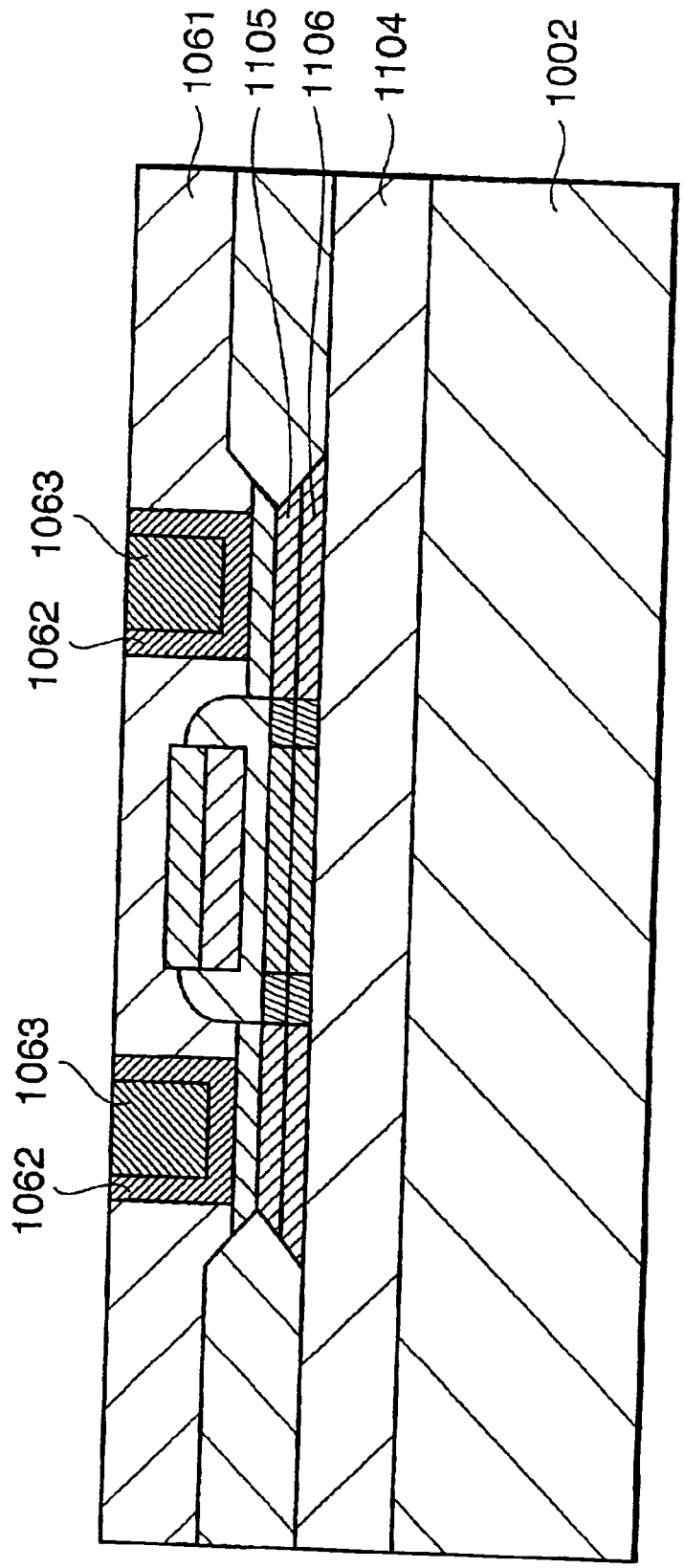

In the step shown in FIG. 5D, an insulating film 1061 is formed to cover the upper surface of the gate electrode and the upper surfaces of the source and drain regions, which are converted into a silicide. As the material of the insulating film 1061, silicon oxide containing phosphorus and/or boron is preferably used.

A contact hole is formed in the insulating film 1061 by CMP, as needed. When photolithography using a KrF excimer laser, ArF excimer laser, $F_2$ excimer laser, electron beam, or X-rays is applied, a rectangular contact hole having a side smaller than 0.25 μm or a circular contact hole having a diameter smaller than 0.25 μm can be formed.

The contact hole is filled with a conductive material. To fill the contact hole with a conductive material, preferably, a film of a refractory metal or a nitride thereof is formed as a barrier metal 1062 on the inner surface of the contact hole, as needed, and then, a conductive material 1063 such as a tungsten alloy, aluminum, aluminum alloy, copper, or copper alloy is deposited using CVD, PVD, or plating. A conductive material deposited higher than the upper surface of the insulating film 1061 may be removed by etch back or CMP. Before filling the contact hole with a conductive material, the surface of the silicide layer in the source and drain regions, which is exposed to the bottom portion of the contact hole, may be nitrided. With the above step, a transistor such as an FET can be formed on the strained Si layer. Hence, a semiconductor device having the structure shown in FIG. 5D can be obtained.

When the thickness and impurity concentration of the active region (strained Si layer) 1103' are determined such that a depletion layer that spreads under the gate insulating film upon applying a voltage to the gate electrode reaches the upper surface of the buried insulating film 1104, the resultant transistor operates as a fully depleted transistor. When the thickness and impurity concentration of the active region (strained Si layer) 1103' are determined such that the depletion layer does to reach the upper surface of the buried insulating film 1104, the resultant transistor operates as a partially depleted transistor.

FIGS. 5A to 5D show only one transistor region. However, to obtain a semiconductor device that attains a desired function, a number of transistors and other circuit elements can be formed on a strained SOI substrate, and interconnections therebetween can be formed.

According to the present invention, a new technique for forming a semiconductor member, e.g., a layer containing silicon and an additive substance on an insulating layer, and a strained silicon layer on the resultant structure can be provided.

As many apparently widely different embodiments of the present invention can be made without departing from the spirit and scope thereof, it is to be understood that the invention is not limited to the specific embodiments thereof except as defined in the appended claims.

What is claimed is:

1. A method of manufacturing a semiconductor member having a layer formed from silicon and an additive material on an insulating layer, comprising:
   a preparation step of preparing a first member having a second layer substantially formed from silicon on a first layer containing silicon and the additive material;
   a transfer step of bonding the first member and a second member via the insulating layer while placing the second layer inside, and transferring the first and second layers from the first member to the second member; and
   a diffusion step of diffusing the additive material contained in the first layer into the second layer.

2. The method according to claim 1, wherein
   the preparation step comprises a stacking step of forming the second layer on the first layer,
   the manufacturing method comprises an insulating layer forming step of forming the insulating layer on the second layer of the first member, and
   the stacking step, insulating layer forming step, and transfer step are executed in an order of the stacking step, insulating layer forming step, and transfer step.

3. The method according to claim 1, wherein
   the first member has a silicon layer under the first layer, and
   in the transfer step, a portion from the silicon layer to the insulating layer is transferred from the first member to the second member.

4. The method according to claim 1, wherein the diffusion step is executed after the transfer step.

5. The method according to claim 1, further comprising, after the diffusion step, a growing step of growing a silicon layer on the first layer on the second member.

6. The method according to claim 1, wherein the diffusion step is executed after the insulating layer forming step and before the transfer step.

7. The method according to claim 2, wherein in the insulating layer forming step, the insulating layer is formed by thermal oxidation with annealing at a temperature enough to diffuse the additive material, thereby executing the insulating layer forming step and diffusion step in parallel.

8. The method according to claim 2, wherein
in the insulating layer forming step, the insulating layer is formed by thermal oxidation with annealing at a temperature enough to diffuse the additive material,
the diffusion step comprises the first and second diffusion steps,
the first diffusion step is executed by annealing in the insulating layer forming step in parallel to the insulating layer forming step, and
the second diffusion step is executed after the transfer step.

9. The method according to claim 8, further comprising, after the second diffusion step, a growing step of growing a silicon layer on the first layer on the second member.

10. The method according to claim 6, further comprising, after the transfer step,
a thermal oxidation step of thermally oxidizing a surface layer of the second member, and
a removal step of removing a thermal oxide film formed on the second member by the thermal oxidation step.

11. The method according to claim 10, further comprising, after the removal step, a growing step of growing a silicon layer on the second member.

12. The method according to claim 1, further comprising, after the transfer step,
a thermal oxidation step of thermally oxidizing a surface layer of the second member, and
a removal step of removing a thermal oxide film formed on the second member by the thermal oxidation step.

13. The method according to claim 12, further comprising, after the removal step, a growing step of growing a silicon layer on the second member.

14. The method according to claim 1, wherein the additive material contains germanium.

15. The method according to claim 1, wherein the insulating layer is a silicon oxide film.

16. The method according to claim 1, wherein
the first member has a separation layer under the first layer, and
in the transfer step, the second member is bonded to the first member having the insulating layer formed by the insulating layer forming step, and then, a member formed by bonding is separated at the separation layer.

17. The method according to claim 1, wherein in the transfer step, a separation layer is formed in the first member having the insulating layer by ion implantation, the second member is bonded to the first member having the separation layer, and then, a member formed by bonding is separated at the separation layer.

18. The method according to claim 1, wherein the first and second layers of the first member are formed by CVD.

19. The method according to claim 17, wherein the first and second layers of the first member are continuously formed in a single CVD step while gradually or stepwise changing a flow rate or concentration of a source gas that supplies the additive material.

20. The method according to claim 1, wherein the first member has the first and second layers on a silicon substrate, and a separation layer at least at one of a portion in the first layer, an interface between the first layer and the silicon substrate, and a portion in the silicon substrate.

21. The method according to claim 20, wherein the separation layer is one of a porous layer formed by anodizing and an ion-implanted layer.

22. The method according to claim 1, wherein the layer formed from silicon and the additive material is made adjacent to the insulating layer by the diffusion step.

23. A method of manufacturing a semiconductor member having a layer formed from silicon and an additive material on an insulating layer, comprising:
a preparation step of preparing a first member having a second layer substantially formed from silicon on a first layer containing silicon and the additive material;
a transfer step of bonding the first member and an insulative second member while placing the second layer inside, and transferring the first and second layers from the first member to the second member; and
a diffusion step of diffusing the additive material contained in the first layer into the second layer.

24. A semiconductor device manufacturing method comprising:
a preparation step of preparing a first member having a second layer substantially formed from silicon on a first layer containing silicon and an additive material;
a transfer step of bonding the first member and a second member via an insulating layer while placing the second layer inside, and transferring the first and second layers from the first member to the second member;
a diffusion step of diffusing the additive material contained in the first layer into the second layer;
a strained silicon layer forming step of forming a strained silicon layer on the first layer transferred onto the second member; and
a circuit element forming step of forming a circuit element on the strained silicon layer.

25. A semiconductor device manufacturing method comprising:
a preparation step of preparing a first member having a second layer substantially formed from silicon on a first layer containing silicon and an additive material;
a transfer step of bonding the first member and an insulative second member while placing the second layer inside, and transferring the first and second layers from the first member to the second member;
a diffusion step of diffusing the additive material contained in the first layer into the second layer;
a strained silicon layer forming step of forming a strained silicon layer on the first layer transferred onto the second member; and
a circuit element forming step of forming a circuit element on the strained silicon layer.

* * * * *

UNITED STATES PATENT AND TRADEMARK OFFICE
CERTIFICATE OF CORRECTION

PATENT NO.    : 6,828,214 B2
DATED         : December 7, 2004
INVENTOR(S)   : Notsu et al.

It is certified that error appears in the above-identified patent and that said Letters Patent is hereby corrected as shown below:

<u>Title page,</u>
Item [56], References Cited, OTHER PUBLICATIONS, "Sendal," (both occurences) should read -- Sendai, --.

Signed and Sealed this

Seventh Day of June, 2005

JON W. DUDAS
*Director of the United States Patent and Trademark Office*